(12) United States Patent
Zhou

(10) Patent No.: US 11,217,222 B2
(45) Date of Patent: Jan. 4, 2022

(54) INPUT SIGNAL-BASED FREQUENCY DOMAIN ADAPTIVE FILTER STABILITY CONTROL

(71) Applicant: Cirrus Logic International Semiconductor Ltd., Edinburgh (GB)

(72) Inventor: Dayong Zhou, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/516,679

(22) Filed: Jul. 19, 2019

(65) Prior Publication Data
US 2021/0020158 A1  Jan. 21, 2021

(51) Int. Cl.
*G10K 11/178* (2006.01)
(52) U.S. Cl.
CPC .............. *G10K 11/17854* (2018.01); *G10K 2210/3028* (2013.01)
(58) Field of Classification Search
CPC ......... G10K 11/1785; G10K 11/17853; G10K 11/17854; G10K 2210/3028; G10K 2210/3025
USPC .................................. 381/71.1, 71.11, 71.14
See application file for complete search history.

(56) References Cited

U.S. PATENT DOCUMENTS

| 9,036,816 | B1 | 5/2015 | Ayrapetian et al. |
| 9,324,311 | B1 | 4/2016 | Abdollahzadeh Milani et al. |
| 9,502,020 | B1 | 11/2016 | Abdollahzadeh Milani et al. |
| 9,633,646 | B2 | 4/2017 | Hendrix et al. |
| 2009/0060167 | A1 | 3/2009 | Deng et al. |
| 2012/0195439 | A1 | 8/2012 | Ohta et al. |
| 2013/0259252 | A1* | 10/2013 | Yasuda ................ F16F 15/002 381/71.11 |
| 2013/0315408 | A1 | 11/2013 | Yano et al. |
| 2017/0142532 | A1 | 5/2017 | Pan |
| 2017/0178617 | A1* | 6/2017 | Christoph ........ G10K 11/17853 |
| 2017/0229111 | A1 | 8/2017 | Hanazono et al. |
| 2017/0276398 | A1* | 9/2017 | Hanazono ........... F24C 15/2042 |
| 2018/0308465 | A1 | 10/2018 | Zhou et al. |

(Continued)

OTHER PUBLICATIONS

Zhou, Dayong et al. "A New Rapid Frequency-Domain Adaptation of Casual Fir Filters." IEEE DSP Workshop. Sep. 2006. pp. 332-335.

(Continued)

*Primary Examiner* — Jason R Kurr
(74) *Attorney, Agent, or Firm* — E. Alan Davis; James W. Huffman

(57) ABSTRACT

An adaptive filter converts time domain samples of an input signal into frequency domain signals, dynamically adjusts a stability conditional number based on the frequency domain signals, and uses the dynamically adjusted stability conditional number to control step size normalization during adaptation of frequency domain coefficients of the adaptive filter. The stability control number may be global to a range of frequency bins based on a peak magnitude of the input signal and/or may be frequency bin-specific stability control numbers based on corresponding frequency bin-specific error signal magnitudes. The adaptive filter also dynamically adjusts a noise floor based on the frequency domain input signals and refrains from updating frequency domain coefficients when a magnitude of the frequency domain input signal associated with a frequency bin is greater than the dynamically adjusted noise floor.

20 Claims, 9 Drawing Sheets

(56) References Cited

U.S. PATENT DOCUMENTS

2020/0043461 A1* 2/2020 Zollner ............... G10K 11/178
2021/0020157 A1 1/2021 Zhou et al.

OTHER PUBLICATIONS

Wu, Ming et al. "An Improved Active Noise Control Algorithm Without Secondary Path Identification Based on the Frequency-Domain Subband Architecture." IEEE Transactions on Audio, Speech, and Language Processing. vol. 16, No. 8, Nov. 2008. pp. 1409-1419.

Morgan, Dennis R. et al. "A Delayless Subband Adaptive Filter Architecture." IEEE Transactions on Signal Processing, vol. 43, No. 8. Aug. 1995. pp. 1819-1820.

Park, Seon Joon et al. "A Delayless Subband Active Noise Control System for Wideband Noise Control." IEEE Transactions on Speech and Audio Processing. vol. 9, No. 8. Nov. 2001. pp. 892-899.

Yang, Feiran et al. "Frequency-Domain Filtered-x LMS Algorithms for Active Noise Control: A Review and New Insights." Applied Science vol. 8, Nov. 20, 2018. pp. 1-20.

Szadkoski, Zbigniew et al. "The Least Mean Squares Adaptive FIR Filter for Narrow-Band RFI Suppression in Radio Detection of Cosmic Rays." *IEEE Transactions on Nuclear Science*, vol. 64, No. 6 Jun. 2017. pp. 1304-1315.

Faza, Ayman et al. "Adaptive Regularization in Frequency-Domain NLMS Filters." 20th European Signal Processing Conference (EUSIPCO 2012) Bucharest, Romania, Aug. 27-31, 2021. pp. 2625-2628.

Chen, Rui et al. "Adaptive Filter by Using Proportionate Frequency Domain Extended Correlation LMS Algorithm in the Double-Talk Condition." Signal Processing, 2008. ICSP 2008. 9th International Conference on IEEE. Piscataway, NJ. Oct. 26, 2008. pp. 1826-1829.

Benesty, Jacob et al. "An Improved PNLMS Algorithm." 2002 IEEE International Conference on Acoustics, Speech, and Signal Processing Proceedings (ICASSP) Orlando, FL. May 13-17, 2002. pp. II-1181 thru II-1184.

* cited by examiner

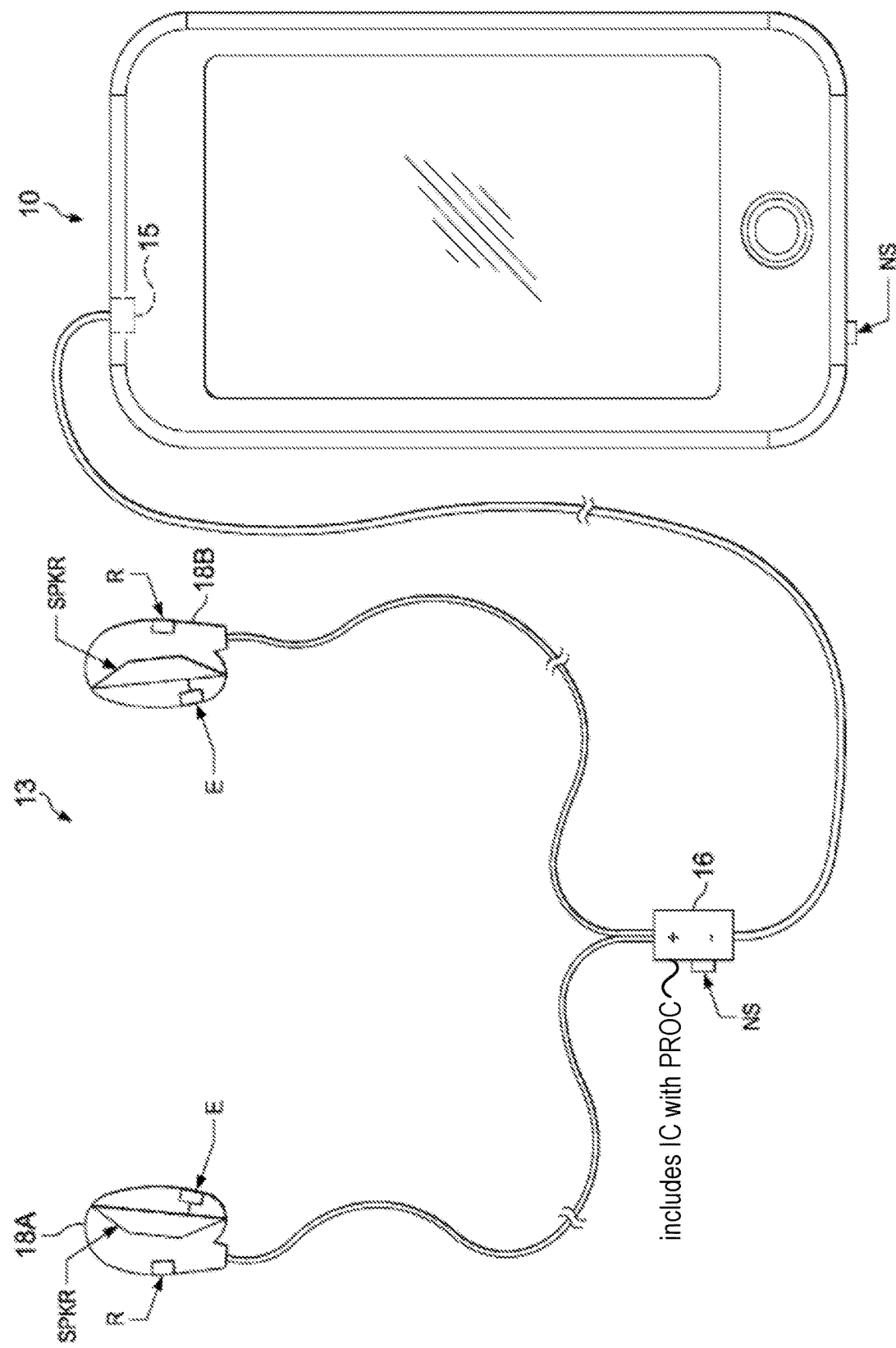

INPUT SIGNAL-BASED FREQUENCY DOMAIN ADAPTIVE FILTER STABILITY CONTROL

BACKGROUND

An adaptive filter iteratively models the relationship between two signals in real time. Generally, an adaptive filter receives an input signal and computes an output signal based on the input signal. The adaptive filter includes parameters that may be iteratively changed to alter the input-output relationship of the filter. The output signal is compared to a desired response signal by subtracting the output signal from the desired response signal to produce an error signal. The error signal is used to adapt the filter parameters over time according to an adaptation algorithm. The goal of the adaptation algorithm is for the output signal of the filter to eventually more closely match the desired response signal, as indicated by a decrease in the power of the error signal.

Adaptive filters may be employed in a variety of applications. For example, an adaptive filter may be employed to model the effects of a transmission channel that distorts transmitted symbols (e.g., inter-symbol interference) in order to aid in detecting the symbols at the receiver. For another example, an adaptive filter may be employed to model the transfer function of a plant so that a suitable control signal may be calculated and applied to control the plant. For another example, an adaptive filter may be employed to cancel echoes in long distance transmissions such as telephone networks, or to cancel acoustic echoes for conference-style speakerphones. For another example, an adaptive filter may be employed to perform adaptive noise cancelling, such as to cancel a stronger maternal heartbeat in an electroencephalogram (EEG) in order to enable extraction of the weaker heartbeat of an unborn child. For another example, an adaptive filter may be employed to perform channel equalization, such as for use in a modem or wireless telecommunication system. For another example, an adaptive filter may be employed to perform linear predictive coding (LPC), such as for use in modeling signal correlations for a short block of data to reduce the number of bits needed to represent a signal waveform, such as a speech signal. For another example, an adaptive filter may be employed to separate a broadband signal and a nearly periodic signal, which is commonly referred to as adaptive line enhancement. For another example, an adaptive filter may be employed to perform active noise cancellation to cancel ambient noise, such as during use of a mobile phone or headset.

Generally speaking, a filter includes filter coefficients. In the case of a finite impulse response (FIR) filter, for example, the filter coefficients are multiplied by corresponding samples of the input signal and the resulting products are summed to produce the output signal. In the case of an adaptive filter, the coefficients are updated from time to time. In the case of a time domain adaptive filter, time domain samples of the error signal and the input signal are used to update the filter coefficients according to an adaptive algorithm, e.g., least-mean-square (LMS). In the case of a frequency domain adaptive filter, the adaptive filter coefficients are updated in the frequency domain rather than in the time domain. That is, filter coefficients that correspond to frequency bins are maintained. Blocks of the time domain error and input signals are transformed to the frequency domain. The adaptive algorithm uses the frequency domain component of the error and input signal associated with a frequency bin to update the filter coefficient for the frequency bin. The frequency domain coefficients can then be transformed back to the time domain and applied to the time domain input signal. Alternatively, the frequency domain coefficients can be applied to a frequency domain version of the input signal.

As the output signal of an adaptive filter more closely matches the desired response signal as indicated by a decrease in the error signal power, the adaptive filter is said to converge. It is desirable for an adaptive filter, including a frequency domain adaptive filter, to converge quickly. For example, in a noise cancellation application, it is desirable for the adaptive filter to converge as quickly as possible in order to cancel the noise as quickly as possible. However, it is also possible for an adaptive filter to diverge and become unstable as the coefficients become too large. Controlling the stability of an adaptive filter whose adaptation is performed in the frequency domain may be a significant challenge, particularly in applications that have a large dynamic range of input signal in the frequency domain, e.g., audio applications that involve speech and/or music, among others.

SUMMARY

In one embodiment, the present disclosure provides an adaptive filter that includes a digital signal processor programmed to convert time domain samples of a signal that is input to an adaptive filter into frequency domain signals, dynamically adjust a stability conditional number based on the frequency domain signals, and use the dynamically adjusted stability conditional number to control step size normalization during adaptation of frequency domain coefficients of the adaptive filter.

In another embodiment, the present disclosure provides a method that includes converting time domain samples of a signal that is input to an adaptive filter into frequency domain signals, dynamically adjusting a stability conditional number based on the frequency domain signals, and using the dynamically adjusted stability conditional number to control step size normalization during adaptation of frequency domain coefficients of the adaptive filter.

The stability control number may be dynamically adjusted based on a peak magnitude among the frequency domain signals of the frequency bins. The peak magnitude may be scaled by two different values to generate two different stability control numbers for use to control step size normalization within respective sets of frequency bins. Frequency bin-specific stability control numbers may be dynamically adjusted based on magnitudes of frequency domain error signals of corresponding frequency bins. Both frequency bin-specific stability control numbers and peak input signal magnitude-based stability control numbers may be used to control step size normalization during adaptation of the frequency domain coefficients. The adaptive filter may be used in an active noise cancellation system to generate an anti-noise signal or to model an electro-acoustic path of an audio device.

In yet another embodiment, the present disclosure provides an adaptive filter that includes a digital signal processor programmed to convert time domain samples of the input signal of the adaptive filter into frequency domain input signals of associated frequency bins and dynamically adjust a noise floor based on the frequency domain input signals. The digital signal processor is further programmed to use the dynamically adjusted noise floor to selectively update frequency domain coefficients associated with the frequency bins by, for each frequency bin of the frequency bins, updating the frequency domain coefficient associated with the frequency bin when a magnitude of the frequency domain input signal associated with the frequency bin is greater than the dynamically adjusted noise floor and refraining from updating the frequency domain coefficient associated with the frequency bin when the magnitude of the frequency domain input signal associated with the frequency bin is less than the dynamically adjusted noise floor.

In yet another embodiment, the present disclosure provides a method that includes converting time domain samples of an input signal to an adaptive filter into frequency domain input signals of associated frequency bins and dynamically adjusting a noise floor based on the frequency domain input signals. The method also includes using the dynamically adjusted noise floor to selectively update frequency domain coefficients associated with the frequency bins by, for each frequency bin of the frequency bins, updating the frequency domain coefficient associated with the frequency bin when a magnitude of the frequency domain input signal associated with the frequency bin is greater than the dynamically adjusted noise floor and refraining from updating the frequency domain coefficient associated with the frequency bin when the magnitude of the frequency domain input signal associated with the frequency bin is less than the dynamically adjusted noise floor.

The noise floor may be dynamically adjusted based on a peak magnitude among the frequency domain signals of the frequency bins. The noise floor may be employed only above a threshold frequency. The adaptive filter may be used in an active noise cancellation system to generate an anti-noise signal or to model an electro-acoustic path of an audio device.

BRIEF DESCRIPTION OF THE DRAWINGS

FIG. 6B is an example wireless telephone having a headset assembly coupled to it via audio port in accordance with embodiments of the present disclosure.

DETAILED DESCRIPTION

Embodiments are described that may significantly improve adaptation stability by dynamically adjusting a noise floor based on the peak input signal magnitude among the frequency bins and comparing the input signal magnitude of each frequency bin to the dynamically adjusted noise floor to selectively adapt the corresponding frequency domain filter coefficient. Other embodiments are described that may significantly improve adaptation stability by dynamically adjusting stability conditional numbers based on the peak input signal magnitude and/or dynamically adjusting frequency bin-specific stability control numbers based on the frequency bin-specific error signal magnitude and using the dynamically adjusted stability conditional numbers to control step size normalization during adaptation of the frequency domain coefficients. Dynamic adjustments may be made not only on current input signal overall power, but also by comparing individual frequency bins to the full band peak power ratio.

Figure 1:
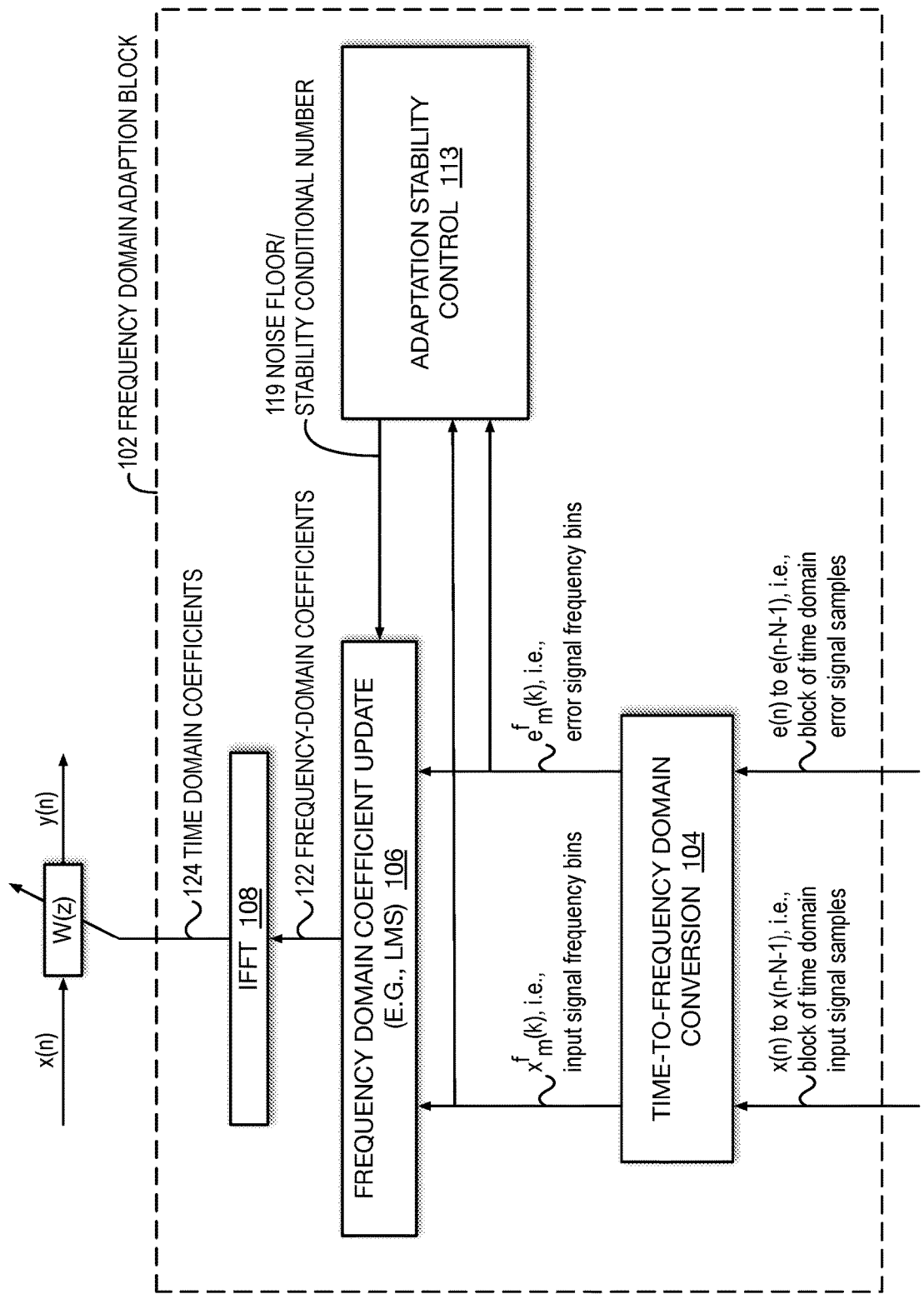
FIG. 1 is an example block diagram of an adaptive filter that includes a frequency domain coefficient adaptation block that dynamically adjusts stability control parameters (e.g., stability conditional number (SCN), noise floor (NF)) based on one or more input signals to the adaptive filter in accordance with embodiments of the present disclosure.

FIG. 1 is an example block diagram of an adaptive filter 100 that includes a frequency domain coefficient adaptation block 102 that dynamically adjusts stability control parameters (e.g., stability conditional number (SCN), noise floor (NF)) based on one or more input signals to the adaptive filter 100 in accordance with embodiments of the present disclosure. The adaptive filter 100 includes a time domain filter W(z) that receives an input signal x(n) and time domain filter coefficients 124 from the frequency domain adaptation block 102. For each time frame n, the time domain filter W(z) applies the time domain filter coefficients 124 to the input signal x(n) to produce an output signal y(n).

The frequency domain adaptation block 102 includes a time-to-frequency domain conversion block 104, a frequency domain coefficient update block 106, an inverse fast Fourier transform (IFFT) block 108, and an adaptation stability control block 113. The time-to-frequency domain conversion block 104 converts a block of N time domain input signal samples x(n) to x(n-N-1) (e.g., N=512 or 1024) into a frequency domain input signal $x_m^f(k)$, where m is a frequency bin index of M frequency bins (e.g., M=512 or 1024), and k is a sample block index. The time-to-frequency domain conversion block 104 also converts a block of N time domain error signal samples e(n) to e(n-N-1) into a frequency domain error signal $e_m^f(k)$. The frequency domain input signal $x_m^f(k)$ and the frequency domain error signal $e_m^f(k)$ are received by both the frequency domain coefficient update block 106 and the adaptation stability control block 113. In one embodiment, the time-to-frequency domain conversion block 104 includes blocks to perform polyphase filtering of the input and error signals.

The frequency domain coefficient update block 106 uses the frequency domain input signal $x_m^f(k)$ and frequency domain error signal $e_m^f(k)$, along with a noise floor and stability conditional numbers 119 associated with the M frequency bins received from the adaptation stability control block 113, to generate updated frequency domain coefficients 122. The IFFT block 108 converts the frequency domain coefficients 122 to the time domain coefficients 124 provided to the time domain filter W(z).

One potential problem with use of an adaptive filter is that it may become unstable. More specifically, the coefficients of the adaptive filter may be adapted to become very large values, in which case the input signal may be multiplied by the large coefficients, which may create a very large output signal, which may be problematic for the system in which the adaptive filter is employed. This may be particularly true in an adaptive filter that updates its coefficients in the frequency domain if the dynamic range of the input signal in the frequency domain is large.

Equation (1) expresses an LMS adaptation algorithm for computing a frequency domain filter coefficient of a next sample block k+1 for a frequency bin m $$w_m^f(k+1) = w_m^f(k) + \mu_m x_m^{f*}(k) e_m^f(k) \qquad (1)$$

where $w_m^f(k)$ is the frequency domain filter coefficient of current sample block k for frequency bin m, $\mu_m$ is the step size for frequency bin m, $x_m^{f*}(k)$ is the complex conjugate of the frequency domain input signal of current sample block k for frequency bin m, and $e_m^f(k)$ is the frequency domain error signal of current sample block k for frequency bin m. The second term of the right-hand side of equation (1) may be referred to as the step size term.

As may be observed from equation (1), in the event that the input signal and/or error signal becomes very large, the coefficients may become very large causing the adaptive filter to become unstable. To remedy this problem, a normalized LMS adaptation algorithm was developed, which may be expressed in equation (2)

$$w_m^f(k+1) = w_m^f(k) + \mu_m \frac{x_m^{f*}(k) e_m^f(k)}{\left| x_m^f(k) \right|^2} \qquad (2)$$

where $|x_m^f(k)|$ is the magnitude of the input signal. The use of the input signal magnitude in the denominator of the step size term serves to reduce the likelihood of instability and is referred to as step size normalization.

As may be observed from equation (2), a potential problem may be introduced by the step size normalization if the magnitude of the input signal becomes very small causing the step size term to become very large. The potential problem is minimal if the error signal is correlated to the input signal since the error signal will be small if the input signal is small (although a disturbance could still be introduced when the input signal magnitude is small enough to invoke precision error during the computation of equation (2)).

However, although in many cases the error signal $e_m^f(k)$ may have a component that is correlated to the input signal $x_m^f(k)$, which may be referred to as the correlated error signal $\text{corr}_m^f(k)$, the error signal may also have a component that is uncorrelated to the input signal, which may be referred to as the interference signal $\text{int}_m^f(k)$. Thus, the error signal may be expressed according to equation (3)

$$e_m^f(k) = \text{corr}_m^f(k) + \text{int}_m^f(k) \qquad (3)$$

where $\text{corr}_m^f(k)$ is effectively the product of the input signal and a constant gain value, G, as expressed in equation (4).

$$\text{corr}_m^f(k) = x_m^f(k) * G \qquad (4)$$

Substituting equations (3) and (4) into equation (2) yields equation (5).

$$w_m^f(k+1) \cong w_m^f(k) + \mu_m * G + \mu_m \frac{\text{int}_m^f(k)}{|x_m^f(k)|} \qquad (5)$$

As may be observed from Equation (5), a danger exists that the second step size term may become very large if the interference signal is amplified by a very small input signal magnitude and/or if the interference signal becomes very large, which may result in instability of the adaptive filter. To address this problem, a small number referred to as a stability conditional number ξ may be added to the denominator of equation (2) as expressed in equation (6) to improve the stability of the adaptation step size normalization.

$$w_m^f(k+1) = w_m^f(k) + \mu_m \frac{x_m^{f*}(k) e_m^f(k)}{\left( |x_m^f(k)| + \xi \right)^2} \qquad (6)$$

However, it may be difficult to select a value of the stability conditional number that works well in all situations. In particular, in an adaptive filter in which the coefficients are updated in the frequency domain, the magnitude of the input signal may be large for some frequency bins and small for other frequency bins, particularly where the dynamic range of the input signal is relatively large. On the one hand, if the stability conditional number is chosen with a value too small, it may not provide sufficient protection from instability. On the other hand, if the stability conditional number is chosen with a value too large, it may needlessly slow the speed of adaptation. Therefore, embodiments are described in which a global stability conditional number is dynamically adjusted based on the peak magnitude of the input signal among the frequency bins and/or a frequency-bin specific stability conditional number is dynamically adjusted based on the magnitude of the error signal for each frequency bin.

Another technique that may be employed to improve adaptive filter adaptation stability is the employment of a noise floor (NF) to selectively update the coefficients of the adaptive filter as expressed in equation (7), i.e., the adaptive filter may refrain from updating a frequency domain coefficient if the input signal magnitude of the frequency bin is below the dynamically adjusted noise floor.

$$w_m^f(k+1) = \begin{cases} w_m^f(k); & \text{when } |x_m^f(k)| \leq \text{NoiseFloor} \\ w_m^f(k) + \mu_m \dfrac{x_m^{f*}(k) e_m^f(k)}{|x_m^f(k)|^2}; & \text{when } |x_m^f(k)| > \text{NoiseFloor} \end{cases} \qquad (7)$$

However, employing a noise floor constraint may needlessly slow the adaptation speed of the adaptive filter. As with the stability conditional number, it may be difficult to select a value of the noise floor that works well in all situations. On the one hand, if the noise floor is chosen with a value too small, it may not provide sufficient protection from instability. On the other hand, if the noise floor is chosen with a value too large, it may needlessly slow the speed of adaptation, particularly in the presence of a weak input signal. Therefore, embodiments are described in which the noise floor is dynamically adjusted based on the peak magnitude of the input signal among the frequency bins, as described in more detail below. The dynamically adjusted noise floor parameter may be employed in addition to the dynamically adjusted stability conditional number parameter. As mentioned above, the input signal may have a large dynamic frequency range such that the input signal magnitude varies greatly within the frequency bins of the input signal spectrum; therefore, dynamically varying the noise floor with the peak magnitude of the input signal may advantageously make the adaptive filter more robust against disturbance-induced instability, e.g., due to numerical imprecision error or amplification of the interference signal described above.

Although FIG. 1 describes an embodiment in which the adaptive filter 100 is a finite impulse response (FIR) filter, other embodiments are contemplated in which an infinite impulse response (IIR) filter or a lattice filter is employed. In one embodiment, the frequency domain adaptive filter 100 comprises a digital signal processor (DSP) programmed to perform operations of adaptive filter embodiments described herein. Furthermore, it should be understood that the input signal x(n) and the error signal e(n) are both input to the adaptive filter 100. In this sense, the error signal e(n) is also an input to the adaptive filter 100. The input signal x(n) may also be referred to as the training signal or reference signal. Still further, in one embodiment, $|x_m^f(k)|$ may be replaced in one of the factors of the denominator with $|x_m^f(k)|_{max}$, i.e., the peak magnitude among the frequency bins of the input signal, e.g., as in equation (18) below.

Figure 2:
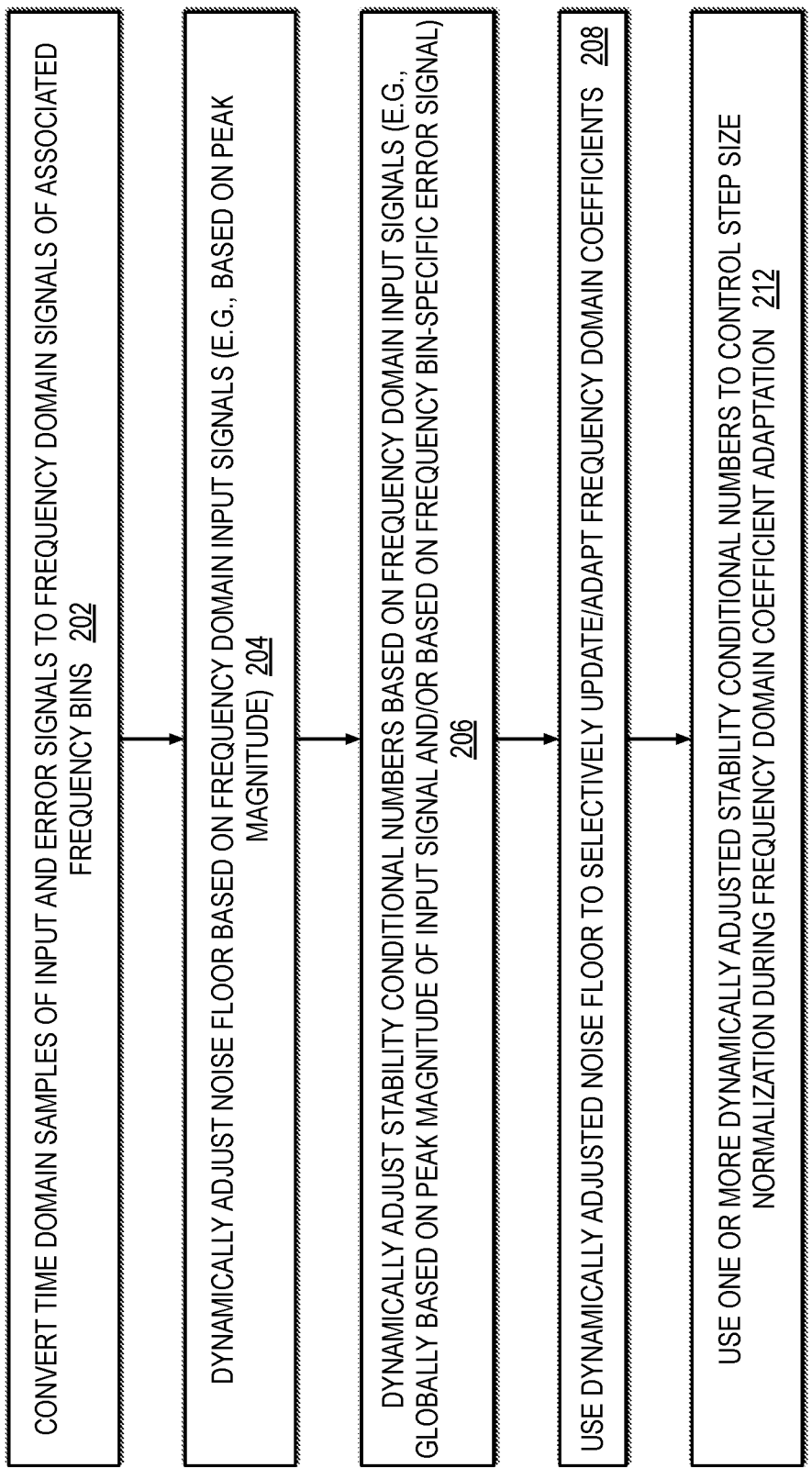
FIG. 2 is an example flowchart illustrating operation of an adaptive filter in accordance with embodiments of the present disclosure.

FIG. 2 is an example flowchart illustrating operation of an adaptive filter (e.g., adaptive filter 100) of FIG. 1 in accordance with embodiments of the present disclosure. Operation begins at block 202.

At block 202, the adaptive filter (e.g., time-to-frequency domain conversion block 104 of FIG. 1) converts time domain samples of its input signals (e.g., input signals x(n) and e(n) of FIG. 1) to frequency domain signals (e.g., input signals $x_m^f(k)$ and error signals $e_m^f(k)$) of associated frequency bins. Operation proceeds to block 204.

Figure 5:
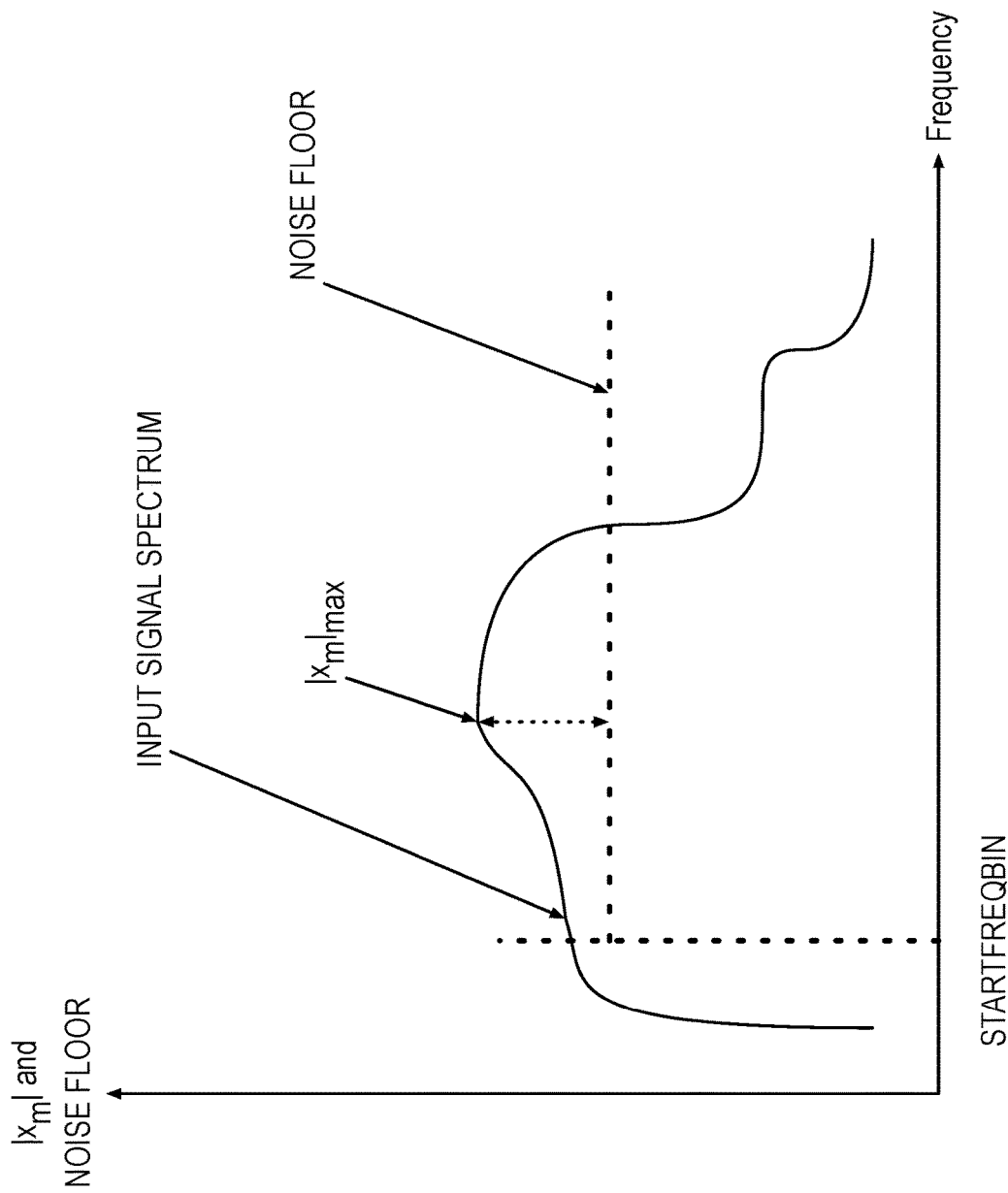
FIG. 5 is an example of a graph illustrating dynamic adjustment of a noise floor based on a peak magnitude of a frequency domain input signal in accordance with embodiments of the present disclosure.

At block 204, the adaptive filter (e.g., frequency domain adaptation block 102 of FIG. 1) dynamically adjusts the noise floor based on the frequency domain input signals $x_m^f(k)$. For example, the adaptation block 102 may dynamically adjust the noise floor based on the peak magnitude $|x_m^f(k)|_{max}$ among the frequency bins of the frequency domain input signals, as shown in FIG. 5 and as expressed in equation (8), where NOISE_FLOOR_SCALE is a tunable scaling factor that a user may select. Operation proceeds to block 206.

$$\text{NoiseFloor}^f(k)=|x_m^f(k)|_{max}*\text{NOISE\_FLOOR\_SCALE} \quad (8)$$

At block 206, the adaptive filter dynamically adjusts stability conditional numbers based on its input signals. In one embodiment, the adaptive filter dynamically adjusts a global stability conditional number $\xi 1^f(k)$ based on the peak magnitude $|x_m^f(k)|_{max}$ among the frequency bins of the frequency domain input signals, as shown in FIG. 3, and as expressed in equation (9), where SCN_SCALE_INPUT is a tunable scaling factor that a user may select.

$$\xi 1^f(k)=|x_m^f(k)|_{max}*\text{SCN\_SCALE\_INPUT} \quad (9)$$

Figure 3:
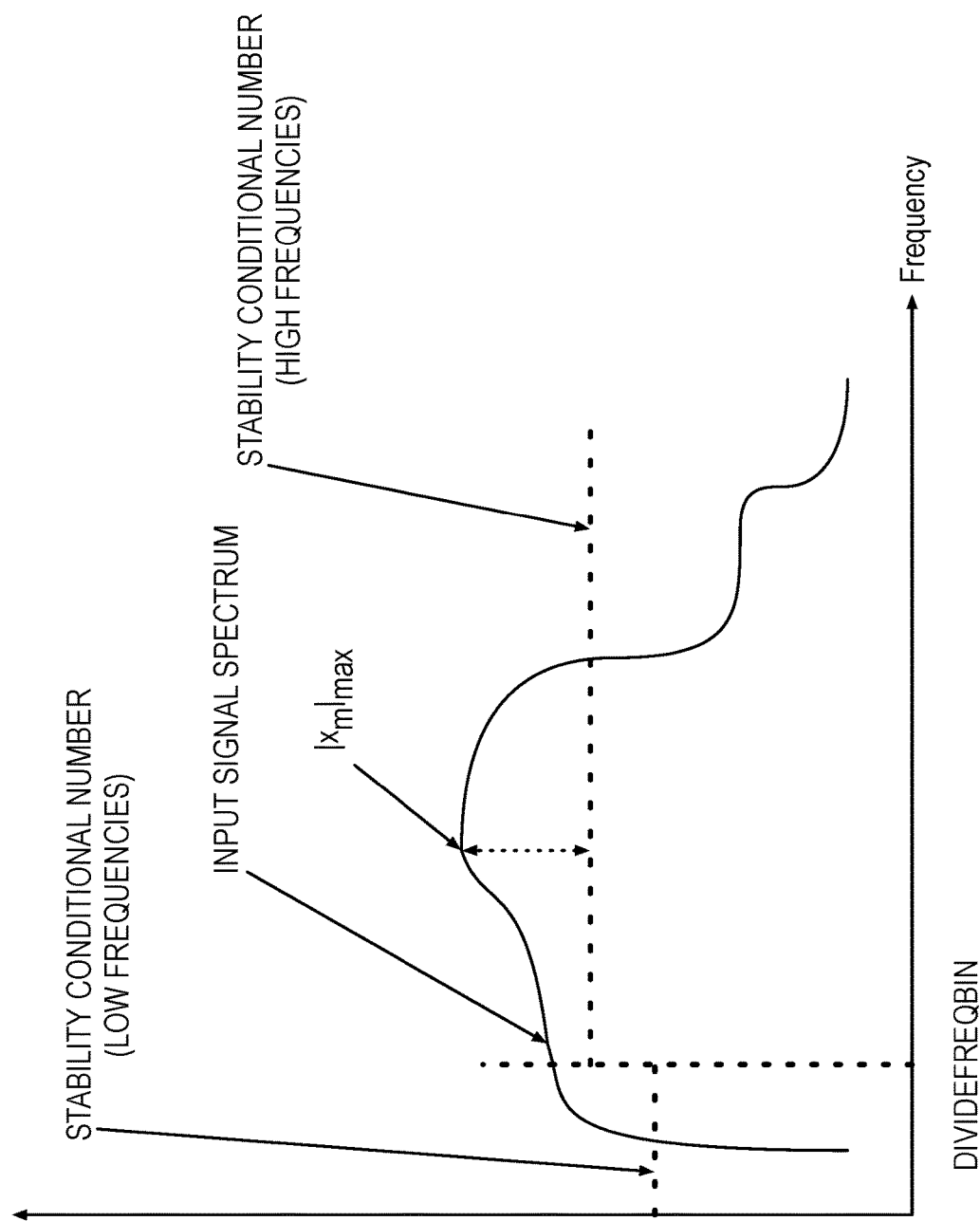
FIG. 3 is an example of a graph illustrating dynamic adjustment of stability condition numbers based on a peak magnitude of a frequency domain input signal in accordance with embodiments of the present disclosure.

In the embodiment of FIG. 3, the peak magnitude of the input signals is used to calculate a first global stability conditional number $\xi 1H^f(k)$ for controlling step size normalization of low frequency bins (e.g., below a DIVIDEFREQBIN shown in FIG. 3) as expressed in equation (10), and a second global stability conditional number $\xi 1L^f(k)$ for controlling step size normalization of high frequency bins as expressed in equation (11), where SCN_SCALE_INPUT_HI and SCN_SCALE_INPUT_LO are respective tunable scaling factors that a user may select.

$$\xi 1H^f(k)=|x_m^f(k)|_{max}*\text{SCN\_SCALE\_INPUT\_HI} \quad (10)$$

$$\xi 1L^f(k)=|x_m^f(k)|_{max}*\text{SCN\_SCALE\_INPUT\_LO} \quad (11)$$

Figure 4:
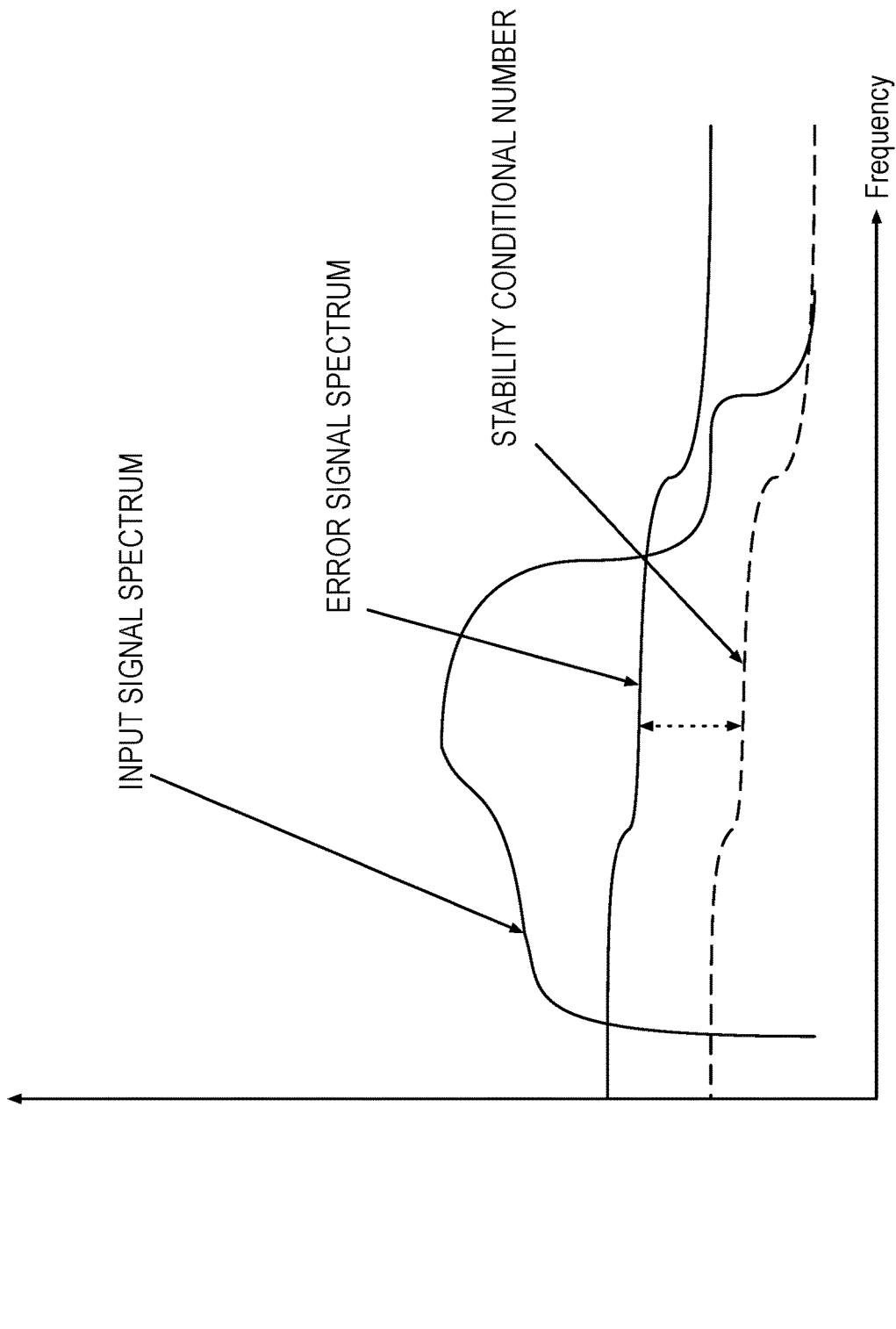
FIG. 4 is an example of a graph illustrating dynamic adjustment of frequency-specific stability condition numbers based on a magnitude of a frequency domain error signal in accordance with embodiments of the present disclosure.

In another embodiment, the adaptive filter, in lieu of or in addition to the global stability conditional numbers, dynamically adjusts a frequency bin-specific stability conditional number $\xi 2_m^f(k)$ for each frequency bin based on the magnitude of the frequency domain error signal $e_m^f(k)$ associated with the frequency bin, as shown in FIG. 4, and as expressed in equation (12), where SCN_SCALE_ERROR is a tunable scaling factor that a user may select. Operation proceeds to block 208.

$$\xi 2_m^f(k)=|e_m^f(k)|*\text{SCN\_SCALE\_ERROR} \quad (12)$$

The error signal-based stability conditional number $\xi_m^f(k)$ scales with the error signal magnitude for the frequency bin to control the step size normalization, which advantageously provides protection against amplification of the interference signal described above.

At block 208, the adaptive filter employs the dynamically adjusted noise floor calculated at block 204 by selectively updating, or adapting, its frequency domain coefficients using the dynamically adjusted noise floor calculated at block 204. In one embodiment, the adaptive filter selectively updates the coefficients according to equation (13) based on the noise floor dynamically adjusted according to equation (8). The adaptive filter may include a frequency bin, referred to in FIG. 5 as STARTFREQBIN, at which it begins to employ the dynamically adjusted noise floor. If the adaptive filter does adapt a frequency bin coefficient (e.g., when the input signal magnitude of the frequency bin is greater than the dynamically adjusted noise floor, as in the lower line of equation (13)), the adaptive filter may use one or more dynamically adjusted stability conditional numbers (e.g., calculated at block 206) to control step size normalization (e.g., per block 212 below). Operation proceeds to block 212.

$$w_m^f(k+1) = \begin{cases} w_m^f(k); & \text{when } |x_m^f(k)| \le \text{NoiseFloor}^f(k) \\ w_m^f(k) + \mu_m \frac{x_m^{f*}(k)e_m^f(k)}{|x_m^f(k)|^2}; & \text{when } |x_m^f(k)| > \text{NoiseFloor}^f(k) \end{cases} \quad (13)$$

At block 212, the adaptive filter uses the one or more stability conditional numbers calculated at block 206 to control the step size normalization during the frequency domain coefficient adaptation (e.g., at block 208), for example according to one of equations (14) through (18).

$$w_m^f(k+1) = w_m^f(k) + \mu_m \frac{x_m^{f*}(k)e_m^f(k)}{\left(|x_m^f(k)| + \xi 1^f(k)\right)^2} \quad (14)$$

$$w_m^f(k+1) = w_m^f(k) + \mu_m \frac{x_m^{f*}(k)e_m^f(k)}{\left(|x_m^f(k)| + \xi 2_m^f(k)\right)^2} \quad (15)$$

$$w_m^f(k+1) = w_m^f(k) + \mu_m \frac{x_m^{f*}(k)e_m^f(k)}{\left(|x_m^f(k)| + \xi 1^f(k) + \xi 2_m^f(k)\right)^2} \quad (16)$$

-continued $$w_m^f(k+1) = w_m^f(k) + \mu_m \frac{x_m^{f*}(k)e_m^f(k)}{\left(|x_m^f(k)| + \xi1^f(k) + \xi2_m^f(k) + \xi3\right)^2} \quad (17)$$

$$w_m^f(k+1) = w_m^f(k) + \mu_m \frac{x_m^{f*}(k)e_m^f(k)}{\left(|x_m^f(k)| + \xi1^f(k) + \xi2_m^f(k) + \xi3\right)} \\ \left(|x_m^f(k)|_{max} + \xi1^f(k) + \xi2_m^f(k) + \xi3\right) \quad (18)$$

Equation (14) employs a global stability conditional number $\xi1^f(k)$ based on the peak magnitude $|x_m^f(k)|_{max}$ among the frequency bins of the frequency domain input signals as expressed in equation (9). Equation (15) employs a frequency bin-specific stability conditional number $\xi2_m^f(k)$ for each frequency bin based on the magnitude of the frequency domain error signal $e_m^f(k)$ associated with the frequency bin as expressed in equation (12). Equation (16) employs both a global stability conditional number $\xi1^f(k)$ based on the peak magnitude and a frequency bin-specific stability conditional number. Equation (17) employs stability conditional numbers of equation (16) in addition to a static stability conditional number $\xi3$. Equation (18) employs stability conditional numbers of equation (17); however, in one of the factors of the denominator, the peak magnitude $|x_m^f(k)|_{max}$ among the frequency bins of the input signal is used rather than the frequency bin-specific input signal.

Figure 6A:
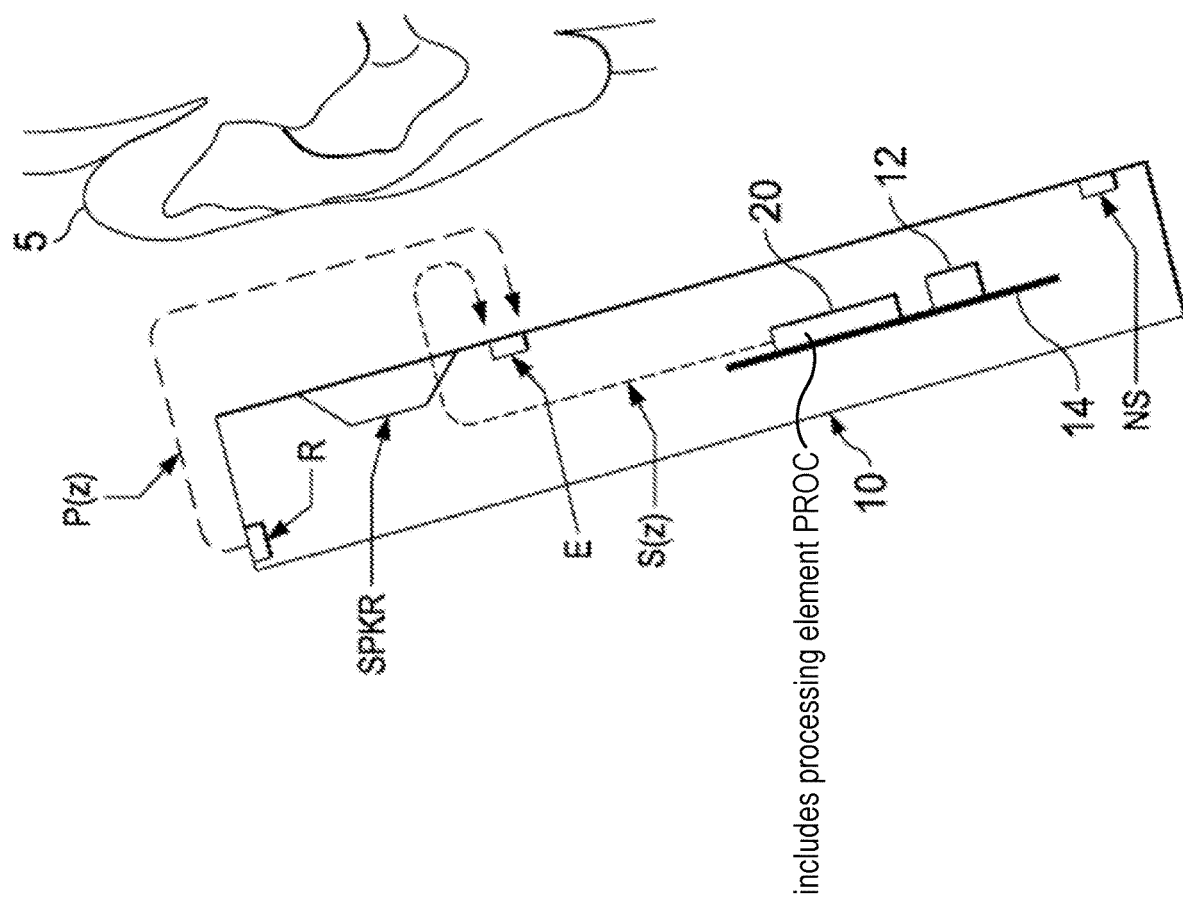
FIG. 6A is an example wireless telephone in accordance with embodiments of the present disclosure shown in proximity to a human ear.

FIG. 6A illustrates an example wireless telephone 10 in accordance with embodiments of the present disclosure shown in proximity to a human ear 5. Wireless telephone 10 is an example of an ANC-enabled portable audio device in which techniques for dynamically adjusting stability control parameters (e.g., stability conditional number, noise floor) based on one or more frequency domain signals (e.g., input signals and/or error signals) to update coefficients of an adaptive filter (e.g., adaptive filter 100 of FIG. 1) in accordance with embodiments of this disclosure may be employed. Wireless telephone 10 may include a transducer such as a speaker SPKR that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. A near-speech microphone NS may be provided to capture near-end speech, which is transmitted from wireless telephone 10 to the other conversation participant(s).

Wireless telephone 10 may include ANC circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when wireless telephone 10 is in close proximity to ear 5. In other embodiments, additional reference and/or error microphones may be employed. Circuit 14 within wireless telephone 10 may include an audio CODEC integrated circuit (IC) 20 that receives the signals from reference microphone R, near-speech microphone NS, and error microphone E and interfaces with other integrated circuits such as a radio-frequency (RF) integrated circuit 12 having a wireless telephone transceiver. In some embodiments of the disclosure, the circuits and techniques disclosed herein may be incorporated in a single integrated circuit that includes control circuits and other functionality for implementing the entirety of the portable audio device, such as an MP3 player-on-a-chip integrated circuit. In these and other embodiments, the circuits and techniques disclosed herein may be implemented partially or fully in software and/or firmware embodied in computer-readable media and executable by a controller or other processing device, such as processing element PROC of IC 20 that may perform operations for implementing a frequency domain adaptive filter as described herein. A processing element is an electronic circuit capable of fetching program instructions stored in addressed memory locations and executing the fetched instructions. IC 20 may also include a non-volatile memory.

In general, the ANC system of portable audio device 10 measures ambient acoustic events (as opposed to the output of speaker SPKR and/or the near-end speech) impinging on reference microphone R, and by also measuring the same ambient acoustic events impinging on error microphone E, ANC processing circuits of wireless telephone 10 adapt an anti-noise signal generated from the output of reference microphone R to have a characteristic that minimizes the amplitude of the ambient acoustic events at error microphone E. Because an acoustic path P(z) extends from reference microphone R to error microphone E, ANC circuits are effectively estimating acoustic path P(z) while removing effects of an electro-acoustic path S(z) that represents the response of the audio output circuits of CODEC IC 20 and the acoustic/electric transfer function of speaker SPKR including the coupling between speaker SPKR and error microphone E in the particular acoustic environment, which may be affected by the proximity and structure of ear 5 and other physical objects and human head structures that may be in proximity to wireless telephone 10, when wireless telephone 10 is not firmly pressed to ear 5. While the illustrated wireless telephone 10 includes a two-microphone ANC system with a third near-speech microphone NS, some aspects and embodiments of the present disclosure may be practiced in a system that does not include separate error and reference microphones, or a wireless telephone that uses near-speech microphone NS to perform the function of the reference microphone R. Also, in portable audio devices designed only for audio playback, near-speech microphone NS will generally not be included, and the near-speech signal paths in the circuits described in further detail below may be omitted, without changing the scope of the disclosure, other than to limit the options provided for input to the microphone covering detection schemes.

FIG. 6B depicts an example of a wireless telephone 10 having a headset assembly 13 coupled to it via audio port 15 in accordance with embodiments of the present disclosure. Audio port 15 may be communicatively coupled to RF integrated circuit 12 and/or CODEC IC 20, thus permitting communication between components of headset assembly 13 and one or more of RF integrated circuit 12 and/or CODEC IC 20 (e.g., of FIG. 6A). In other embodiments, the headset assembly 13 may connect wirelessly to the wireless telephone 10, e.g., via Bluetooth or other short-range wireless technology. As shown in FIG. 6B, headset assembly 13 may include a combox 16, a left headphone 18A, and a right headphone 18B. As used in this disclosure, the term "headset" broadly includes any loudspeaker and structure associated therewith that is intended to be mechanically held in place proximate to a listener's ear canal, and includes without limitation earphones, earbuds, and other similar devices. As more specific examples, "headset" may refer to but is not limited to intra-concha earphones, supra-concha earphones, and supra-aural earphones.

Combox 16 or another portion of headset assembly 13 may have a near-speech microphone NS to capture near-end speech in addition to or in lieu of near-speech microphone NS of wireless telephone 10. In addition, each headphone 18A, 18B may include a transducer, such as speaker SPKR, that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. Each headphone 18A, 18B may include a reference microphone R for measuring the ambient acoustic environment and an error microphone E for measuring of the ambient audio combined with the audio reproduced by speaker SPKR close to a listener's ear when such headphone 18A, 18B is engaged with the listener's ear. In some embodiments, CODEC IC 20 may receive the signals from reference microphone R, near-speech microphone NS, and error microphone E of each headphone and perform adaptive noise cancellation for each headphone as described herein.

In other embodiments, headset assembly 13 is an example of an ANC-enabled portable audio device in which techniques in accordance with embodiments of this disclosure may be employed. A CODEC IC having a processing element PROC and non-volatile memory similar to CODEC IC 20 of FIG. 6A or another circuit may be present within headset assembly 13, communicatively coupled to reference microphone R, near-speech microphone NS, and error microphone E, and configured to perform active noise cancellation as described herein. In such embodiments, an acoustic path having a transfer function P(z) that extends from the reference microphone R to the error microphone E similar to that described with respect to FIG. 6A may also exist with respect to the headset assembly 13. Additionally in such embodiments, an electro-acoustic path having a transfer function S(z) that represents the response of the audio output circuits of the CODEC IC of the headset assembly 13 and the acoustic/electric transfer function of speaker SPKR including the coupling between speaker SPKR and error microphone E, similar to those described with respect to FIG. 6A, may also exist with respect to the headset assembly 13.

Figure 7:
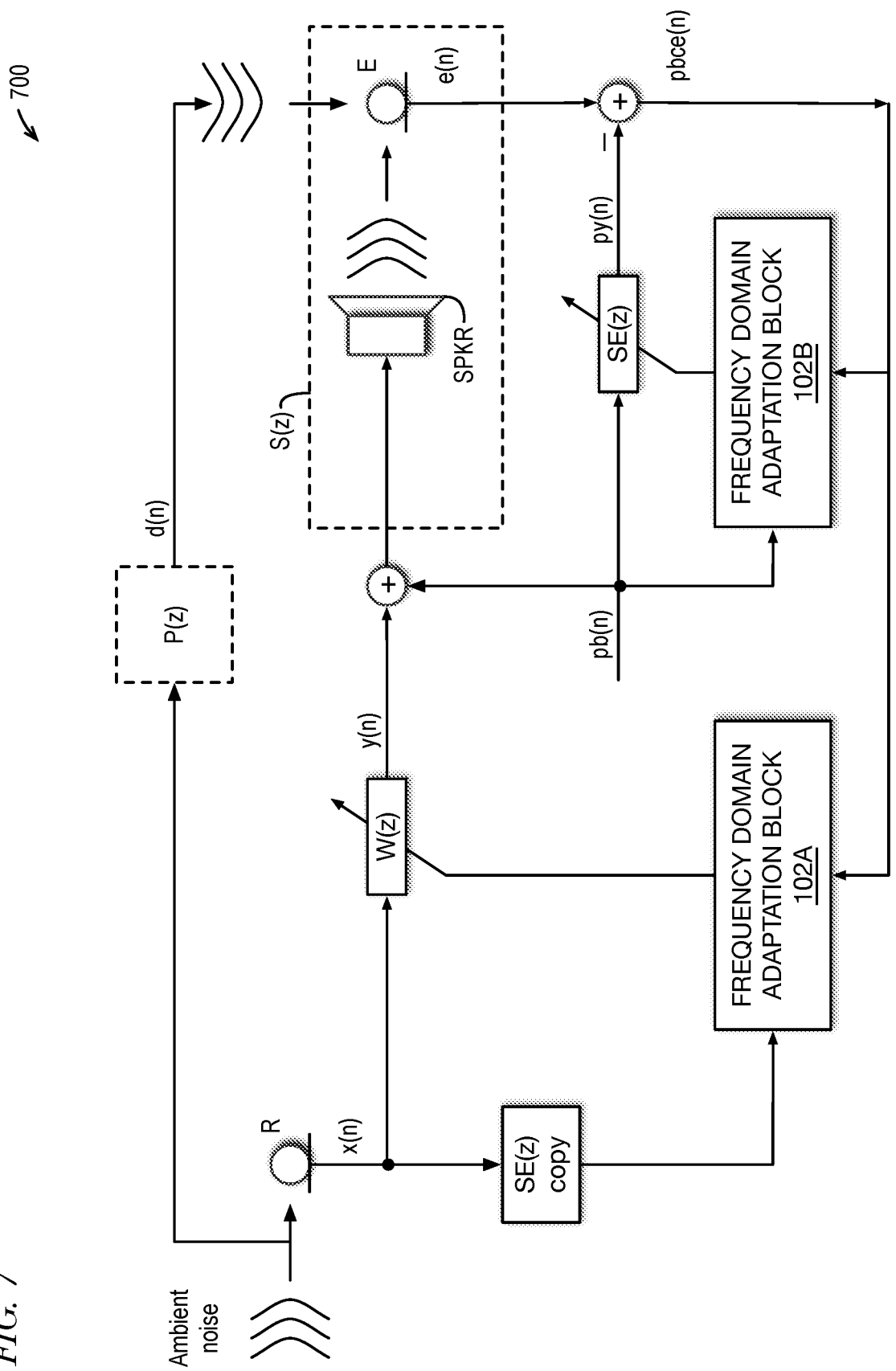
FIG. 7 is an example block diagram of an active noise cancellation (ANC) system that includes frequency domain adaptation blocks that dynamically adjust stability control parameters, e.g., stability conditional number and noise floor, of adaptive filters based on frequency domain input signals and/or error signals to adapt coefficients of the adaptive filters in accordance with embodiments of the present disclosure.

FIG. 7 is an example block diagram of an ANC system 700 that includes frequency domain adaptation blocks 102A and 102B that dynamically adjust stability control parameters, e.g., stability conditional number and noise floor, of adaptive filters W(z) and SE(z), respectively, each of which may be an instance of adaptive filter 100 of FIG. 1, based on frequency domain input signals and/or error signals to adapt coefficients of the adaptive filters in accordance with embodiments of the present disclosure. The ANC system 700 may be employed in an ANC-enabled portable audio device such as those described with respect to FIGS. 6A and 6B, for example.

The ANC system 700 includes a speaker SPKR, a reference microphone R and an error microphone E (e.g., of FIG. 6A or FIG. 6B). Shown in FIG. 7 is an acoustic path P(z) that extends from reference microphone R to error microphone E, as described above with respect to FIGS. 6A and 6B, as well as an electro-acoustic path S(z) that represents the response of the audio output circuits of CODEC IC 20 and the acoustic/electric transfer function of speaker SPKR. Ambient noise impinges upon reference microphone R which responsively generates a reference microphone signal x(n). The ambient noise passes through acoustic path P(z) and emerges as an acoustic ambient noise signal d(n) that impinges on error microphone E, which generates an error microphone signal e(n) in response to acoustic ambient noise signal d(n) and the output of speaker SPKR. Preferably, the ANC system 700 also includes analog-to-digital converters (ADCs) and digital-to-analog (DAC) (not shown). For example, an ADC may convert an analog signal generated by the reference microphone R into the digital reference signal x(n), an ADC may convert an analog signal generated by the error microphone E into the digital error signal e(n), and a DAC may convert a digital signal output by the summing element that sums the digital anti-noise signal y(n) and the digital playback signal pb(n) into an analog signal that is provided (e.g., through an amplifier) to the speaker SPKR.

The ANC system 700 also includes an adaptive anti-noise filter W(z) that adaptively models a transfer function that is the quotient of acoustic path P(z) and electro-acoustic path S(z). Adaptive filter W(z) receives and filters reference microphone signal x(n) to generate anti-noise signal y(n). The goal is that when anti-noise signal y(n) passes through electro-acoustic path S(z), it will emerge from speaker SPKR as an acoustic signal that essentially cancels acoustic ambient noise signal d(n) at error microphone E. The filter coefficients for adaptive filter W(z) are provided by a frequency domain adaptation block 102A. The frequency domain adaptation block 102A dynamically adjusts stability conditional numbers and a noise floor of adaptive filter W(z) based on frequency domain input and/or error signals to update coefficients of adaptive filter W(z).

The ANC system 700 also includes an adaptive electro-acoustic path estimation filter SE(z) and a copy of electro-acoustic path estimation filter SE(z) copy. Adaptive filter SE(z) estimates the transfer function of path S(z). Adaptive filter SE(z) filters a playback signal pb(n) to generate a signal py(n) that represents the playback audio that is expected to be delivered to error microphone E. The filter coefficients for adaptive filters SE(z) and SE(z) copy are provided by a frequency domain adaptation block 102B. The frequency domain adaptation block 102B dynamically adjusts stability conditional numbers and a noise floor of adaptive filter SE(z) based on frequency domain input and/or error signals to update coefficients of adaptive filter SE(z). Adaptive filter SE(z) copy filters reference microphone signal x(n) to generate an output signal that is provided to frequency domain adaptation block 102A.

A first summing element combines playback signal pb(n) and anti-noise signal y(n) to generate a signal provided to speaker SPKR that responsively generates audio output that impinges upon error microphone E. In some embodiments, the first summing element may also combine a distant speech signal and/or a near speech signal. A second summing element subtracts the output signal py(n) of filter SE(z) from error microphone signal e(n) to generate a playback corrected error signal pbce(n). The pbce(n) signal is equal to error microphone signal e(n) after removal of playback signal pb(n) as filtered by filter SE(z) to represent the expected playback audio delivered to error microphone E.

Stated alternatively, the pbce(n) signal includes the content of error microphone signal e(n) that is not due to the playback signal pb(n).

Frequency domain adaptation block 102A performs adaptation of the coefficients for filter W(z), including dynamically adjusting stability conditional numbers and a noise floor of adaptive filter W(z), based on frequency domain versions of the output signal of filter SE(z) copy and playback corrected error signal pbce(n). Frequency domain adaptation block 102B performs adaptation of the coefficients for filter SE(z) and SE(z) copy, including dynamically adjusting stability conditional numbers and a noise floor of adaptive filter W(z), based on frequency domain versions of playback signal pb(n) and playback corrected error signal pbce(n). In other embodiments, the adaptive filter 100 may be employed to estimate a model of an acoustic path (commonly referred to as L) from the speaker SPKR to the reference microphone R, which may be employed in the ANC system to compensate for acoustic energy generated by the speaker SPKR that is picked up by the reference microphone R and transduced as a component of the reference signal x(n). Although an embodiment of an ANC system is shown in FIG. 7, other embodiments are contemplated that use one or more adaptive filters that include a frequency domain adaptation block that performs dynamic step size or leakage parameter adjustment based on analysis of a statistic of coefficient movement.

Although an embodiment of an adaptive filter that includes a frequency domain adaptation block that performs dynamic adjustment of stability conditional numbers and a noise floor of adaptive filters based on frequency domain versions of input and error signals employed in an ANC system such as ANC system 700 has been described, other applications may employ such an adaptive filter, such as channel identification, plant identification and control, echo cancellation, adaptive noise cancelling, channel equalization, linear predictive coding, adaptive line enhancement, etc.

Figure 8:
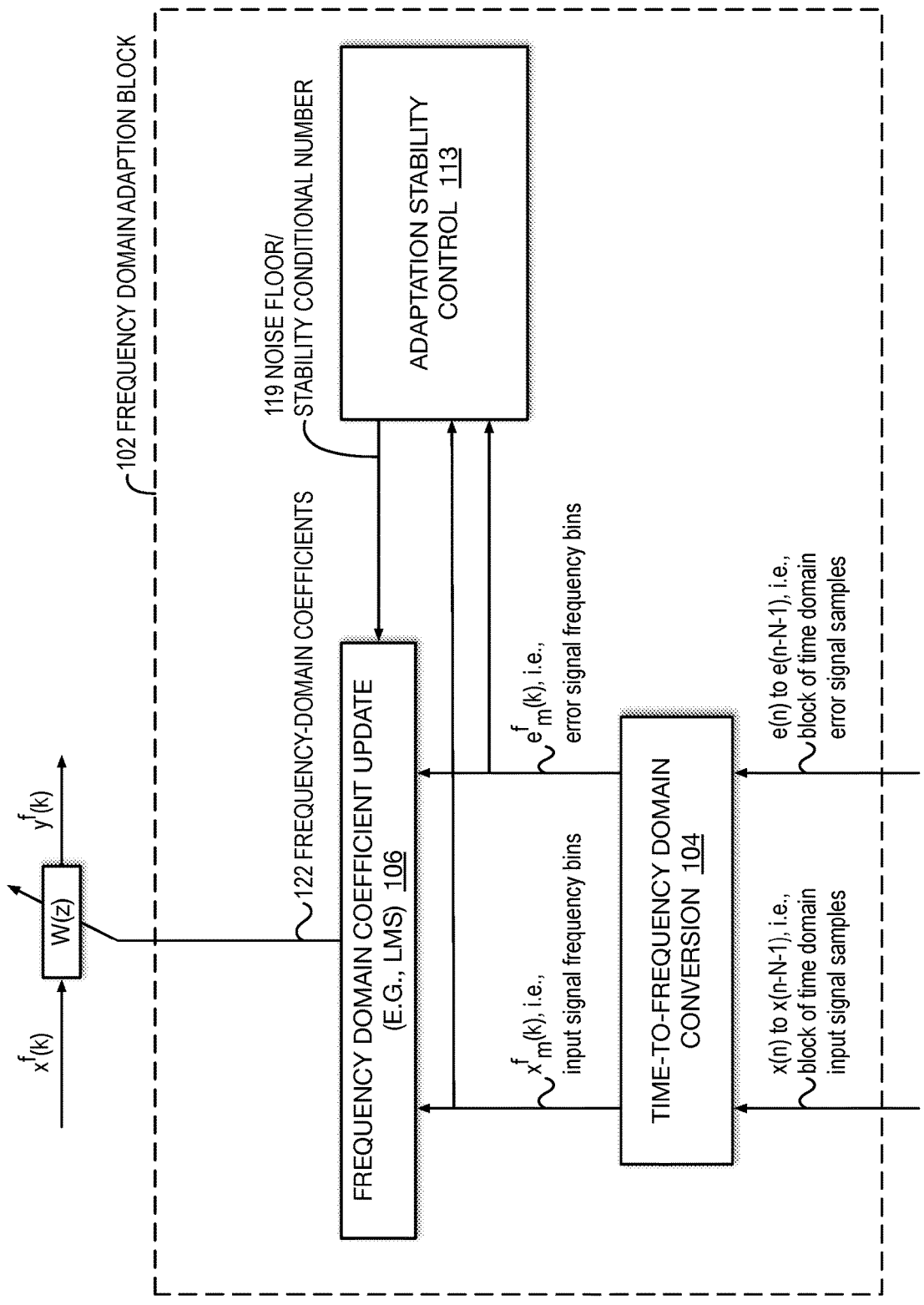
FIG. 8 is an example block diagram of an adaptive filter that includes a frequency domain coefficient adaptation block that dynamically adjusts stability control parameters (e.g., stability conditional number, noise floor) based on one or more input signals to the adaptive filter in accordance with embodiments of the present disclosure.

FIG. 8 is an example block diagram of an adaptive filter 800 that includes a frequency domain coefficient adaptation block 102 that dynamically adjusts stability control parameters (e.g., stability conditional number, noise floor) based on one or more input signals to the adaptive filter 800 in accordance with embodiments of the present disclosure. The adaptive filter 800 includes a frequency domain filter W(z) that receives a frequency domain input signal $x^f(k)$ and frequency domain filter coefficients 122 from the frequency domain adaptation block 102. For each sample block k, the frequency domain filter W(z) applies the frequency domain filter coefficients 122 to the frequency domain input signal $x^f(k)$ to produce a frequency domain output signal $y^f(k)$. The frequency domain output signal $y^f(k)$ may be converted into a time domain output signal, e.g., via an IFFT block (not shown). In many respects, the frequency domain adaptation block 102 is similar to the frequency domain adaptation block 102 of FIG. 1, except that the frequency domain coefficients 122 are provided directly to the frequency domain filter W(z) rather than being first converted to time domain coefficients. Nevertheless, the frequency domain adaptation block 102 of FIG. 8 also dynamically adjusts stability control parameters (e.g., stability conditional number, noise floor) based on frequency domain input and/or error signals. The adaptive filter 100 of FIG. 1 may be characterized as a "delay-less" filter, whereas the adaptive filter 800 of FIG. 8 may include delay due to conversion of a time domain input signal to a frequency domain input signal. Nevertheless, it may be observed from FIG. 8 that an adaptive filter that dynamically adjusts stability control parameters based on frequency domain input and/or error signals may include a frequency domain filter and may be employed in various applications, such as an ANC system or other application that is tolerable of delay in its adaptive filter.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. An adaptive filter, comprising:
    a digital signal processor programmed to:
        convert time domain samples of a signal that is input to the adaptive filter into frequency domain signals;
        dynamically adjust a stability conditional number based on the frequency domain signals; and
        use the dynamically adjusted stability conditional number to control step size normalization during adaptation of frequency domain coefficients of the adaptive filter, wherein the stability conditional number is added to a denominator of a coefficient update equation of the adaptive filter to improve stability of the adaptation step size normalization.

2. The adaptive filter of claim 1,
wherein the frequency domain signals correspond to frequency bins; and
wherein to dynamically adjust the stability conditional number based on the frequency domain signals, the digital signal processor is further programmed to:
dynamically adjust the stability conditional number based on a peak magnitude among the frequency domain signals of the frequency bins.

3. The adaptive filter of claim 2, further comprising:
wherein to dynamically adjust the stability conditional number based on a peak magnitude among the frequency domain signals of the frequency bins, the digital signal processor is further programmed to:
scale the peak magnitude by a first value to generate a first stability conditional number;
scale the peak magnitude by a second value to generate a second stability conditional number, wherein the first and second values are different; and
wherein to use the dynamically adjusted stability conditional number to control step size normalization during adaptation of the frequency domain coefficients, the digital signal processor is further programmed to:
use the first stability conditional number to control step size normalization during adaptation of the frequency domain coefficients associated with a first subset of the frequency bins; and
use the second stability conditional number to control step size normalization during adaptation of the frequency domain coefficients associated with a second subset of the frequency bins.

4. The adaptive filter of claim 1,
wherein the signal that is input to the adaptive filter is an error signal whose time domain samples are converted to frequency domain error signals;
wherein the frequency domain error signals correspond to frequency bins;
wherein to dynamically adjust the stability conditional number based on the frequency domain signals, the digital signal processor is further programmed to:
for each frequency bin of the frequency bins, dynamically adjust a frequency bin-specific stability conditional number based on a magnitude of the corresponding frequency domain error signal; and
wherein to use the dynamically adjusted stability conditional number to control step size normalization during adaptation of the frequency domain coefficients, the digital signal processor is further programmed to:
for each frequency bin of the frequency bins, use the dynamically adjusted frequency bin-specific stability conditional number to control step size normalization during adaptation of the respective frequency domain coefficient corresponding to the frequency bin.

5. The adaptive filter of claim 4, further comprising:
wherein the digital signal processor is further programmed to:
convert time domain samples of an input signal that is input to the adaptive filter into frequency domain input signals;
dynamically adjust a second stability conditional number based on the frequency domain input signals; and
wherein to use the dynamically adjusted stability conditional number to control step size normalization during adaptation of the frequency domain coefficients, the digital signal processor is further programmed to:
for each frequency bin of the frequency bins, use the dynamically adjusted frequency bin-specific stability conditional number and the second dynamically adjusted stability conditional number to control step size normalization during adaptation of the respective frequency domain coefficient corresponding to the frequency bin.

6. The adaptive filter of claim 1,
wherein the adaptive filter is used in an active noise cancellation system to generate an anti-noise signal or to model an electro-acoustic path of an audio device.

7. A method, comprising:
converting time domain samples of a signal that is input to an adaptive filter into frequency domain signals;
dynamically adjusting a stability conditional number based on the frequency domain signals; and
using the dynamically adjusted stability conditional number to control step size normalization during adaptation of frequency domain coefficients of the adaptive filter, wherein the stability conditional number is added to a denominator of a coefficient update equation of the adaptive filter to improve stability of the adaptation step size normalization.

8. The method of claim 7,
wherein the frequency domain signals correspond to frequency bins; and
wherein said dynamically adjusting the stability conditional number based on the frequency domain signals comprises:
dynamically adjusting the stability conditional number based on a peak magnitude among the frequency domain signals of the frequency bins.

9. The method of claim 8, further comprising:
wherein said dynamically adjusting the stability conditional number based on a peak magnitude among the frequency domain signals of the frequency bins comprises:
scaling the peak magnitude by a first value to generate a first stability conditional number;
scaling the peak magnitude by a second value to generate a second stability conditional number, wherein the first and second values are different; and
wherein said using the dynamically adjusted stability conditional number to control step size normalization during adaptation of the frequency domain coefficients comprises:
using the first stability conditional number to control step size normalization during adaptation of the frequency domain coefficients associated with a first subset of the frequency bins; and
using the second stability conditional number to control step size normalization during adaptation of the frequency domain coefficients associated with a second subset of the frequency bins.

10. The method of claim 7,
wherein the signal that is input to the adaptive filter is an error signal whose time domain samples are converted to frequency domain error signals;
wherein the frequency domain error signals correspond to frequency bins;
wherein said dynamically adjusting the stability conditional number based on the frequency domain signals comprises:

for each frequency bin of the frequency bins, dynamically adjusting a frequency bin-specific stability conditional number based on a magnitude of the corresponding frequency domain error signal; and wherein said using the dynamically adjusted stability conditional number to control step size normalization during adaptation of the frequency domain coefficients comprises:

for each frequency bin of the frequency bins, using the dynamically adjusted frequency bin-specific stability conditional number to control step size normalization during adaptation of the respective frequency domain coefficient corresponding to the frequency bin.

11. The method of claim 10, further comprising:
converting time domain samples of an input signal that is input to the adaptive filter into frequency domain input signals;
dynamically adjusting a second stability conditional number based on the frequency domain input signals; and
wherein said using the dynamically adjusted stability conditional number to control step size normalization during adaptation of the frequency domain coefficients comprises:
for each frequency bin of the frequency bins, using the dynamically adjusted frequency bin-specific stability conditional number and the second dynamically adjusted stability conditional number to control step size normalization during adaptation of the respective frequency domain coefficient corresponding to the frequency bin.

12. The method of claim 7,
wherein the adaptive filter is used in an active noise cancellation system to generate an anti-noise signal or to model an electro-acoustic path of an audio device.

13. An adaptive filter, comprising:
a digital signal processor programmed to:
convert time domain samples of an input signal of the adaptive filter into frequency domain input signals of associated frequency bins;
dynamically adjust a noise floor based on the frequency domain input signals; and
use the dynamically adjusted noise floor to selectively update frequency domain coefficients associated with the frequency bins by, for each frequency bin of the frequency bins:
updating the frequency domain coefficient associated with the frequency bin when a magnitude of the frequency domain input signal associated with the frequency bin is greater than the dynamically adjusted noise floor; and
refraining from updating the frequency domain coefficient associated with the frequency bin when the magnitude of the frequency domain input signal associated with the frequency bin is less than the dynamically adjusted noise floor.

14. The adaptive filter of claim 13,
wherein to dynamically adjust the noise floor based on the frequency domain input signals, the digital signal processor is further programmed to:
dynamically adjust a noise floor of the respective frequency bin based on a peak magnitude among the frequency domain input signals.

15. The adaptive filter of claim 13, further comprising:
wherein the digital signal processor is further programmed to, for each frequency bin of the frequency bins:
determine whether the frequency bin is above a frequency bin threshold;
when the frequency bin is above the frequency bin threshold, use the dynamically adjusted noise floor to selectively update the frequency domain coefficient associated with the frequency bin; and
when the frequency bin is not above the frequency bin threshold, update the respective frequency domain coefficient associated with the frequency bin without reference to the dynamically adjusted noise floor.

16. The adaptive filter of claim 13,
wherein the adaptive filter is used in an active noise cancellation system to generate an anti-noise signal or to model an electro-acoustic path of an audio device.

17. A method, comprising:
converting time domain samples of an input signal to an adaptive filter into frequency domain input signals of associated frequency bins;
dynamically adjusting a noise floor based on the frequency domain input signals; and
using the dynamically adjusted noise floor to selectively update frequency domain coefficients associated with the frequency bins by, for each frequency bin of the frequency bins:
updating the frequency domain coefficient associated with the frequency bin when a magnitude of the frequency domain input signal associated with the frequency bin is greater than the dynamically adjusted noise floor; and
refraining from updating the frequency domain coefficient associated with the frequency bin when the magnitude of the frequency domain input signal associated with the frequency bin is less than the dynamically adjusted noise floor.

18. The method of claim 17,
wherein said dynamically adjusting the noise floor based on the frequency domain input signals comprises:
dynamically adjusting a noise floor of the respective frequency bin based on a peak magnitude among the frequency domain input signals.

19. The method of claim 17, further comprising:
for each frequency bin of the frequency bins:
determining whether the frequency bin is above a frequency bin threshold;
when the frequency bin is above the frequency bin threshold, said using the dynamically adjusted noise floor to selectively update the frequency domain coefficient associated with the frequency bin; and
when the frequency bin is not above the frequency bin threshold, updating the respective frequency domain coefficient associated with the frequency bin without reference to the dynamically adjusted noise floor.

20. The method of claim 17,
wherein the adaptive filter is used in an active noise cancellation system to generate an anti-noise signal or to model an electro-acoustic path of an audio device.

* * * * *

UNITED STATES PATENT AND TRADEMARK OFFICE
CERTIFICATE OF CORRECTION

| | |
|---|---|
| PATENT NO. | : 11,217,222 B2 |
| APPLICATION NO. | : 16/516679 |
| DATED | : January 4, 2022 |
| INVENTOR(S) | : Dayong Zhou |

It is certified that error appears in the above-identified patent and that said Letters Patent is hereby corrected as shown below:

In the Claims

In Column 15, Line 12, in Claim 3, delete "a peak magnitude" and insert -- the peak magnitude --, therefor.

In Column 16, Line 39, in Claim 9, delete "a peak magnitude" and insert -- the peak magnitude --, therefor.

Signed and Sealed this
Third Day of May, 2022

Katherine Kelly Vidal
*Director of the United States Patent and Trademark Office*